United States Patent
Zhao et al.

(10) Patent No.: US 9,601,359 B2
(45) Date of Patent: Mar. 21, 2017

(54) SUBSTRATE HOLDING DEVICE, SEMICONDUCTOR FABRICATION DEVICE, AND SUBSTRATE CLAMPING ASCERTAINMENT METHOD

(71) Applicant: NISSIN ION EQUIPMENT CO., LTD, Kyoto-shi, Kyoto (JP)

(72) Inventors: Weijiang Zhao, Kyoto (JP); Kazuki Tobikawa, Kyoto (JP)

(73) Assignee: NISSIN ION EQUIPMENT CO., LTD., Kyoto-Shi, Kyoto (JP)

( * ) Notice: Subject to any disclaimer, the term of this patent is extended or adjusted under 35 U.S.C. 154(b) by 312 days.

(21) Appl. No.: 14/333,798

(22) Filed: Jul. 17, 2014

(65) Prior Publication Data

US 2015/0162232 A1    Jun. 11, 2015

(30) Foreign Application Priority Data

Dec. 11, 2013  (JP) .................................. 2013-256521

(51) Int. Cl.
  *H01L 21/683*  (2006.01)
  *H01L 21/67*  (2006.01)

(52) U.S. Cl.
  CPC .. *H01L 21/67259* (2013.01); *H01L 21/67288* (2013.01); *H01L 21/6831* (2013.01)

(58) Field of Classification Search
  CPC ............. H01L 21/6831; H01L 21/6833; H01L 21/67259; H01L 21/67288
  USPC ....................................................... 361/234
  See application file for complete search history.

(56) References Cited

U.S. PATENT DOCUMENTS

| | | | | |
|---|---|---|---|---|
| 5,436,790 A | * | 7/1995 | Blake ................ | H01L 21/6831 361/234 |
| 2001/0055189 A1 | * | 12/2001 | Hagi .................... | B23Q 3/154 361/234 |
| 2006/0023393 A1 | * | 2/2006 | Poh ...................... | B23Q 3/154 361/234 |
| 2015/0138687 A1 | * | 5/2015 | Boyd, Jr. ............ | H01L 21/67288 361/234 |

FOREIGN PATENT DOCUMENTS

JP         07-211768 A1    8/1995

* cited by examiner

*Primary Examiner* — Thienvu Tran
*Assistant Examiner* — Kevin J Comber
(74) *Attorney, Agent, or Firm* — Procopio, Cory, Hargreaves & Savitch LLP

(57) ABSTRACT

A substrate holding device is provided with an electrostatic chuck that has an electrode therein and is provided with a substrate holding surface, on one side of which a substrate is held; a displacement gauge that is disposed above or below the substrate holding surface; and a controller which, along with using the displacement gauge to measure a first distance to the substrate when a substrate is placed on the substrate holding surface, uses the displacement gauge to measure a second distance to the substrate after a predetermined voltage is applied to the electrode of the electrostatic chuck and, based on the difference between the measured distances, ascertains whether the clamping of the substrate to the electrostatic chuck has been performed in a normal manner.

7 Claims, 10 Drawing Sheets

SUBSTRATE HOLDING DEVICE, SEMICONDUCTOR FABRICATION DEVICE, AND SUBSTRATE CLAMPING ASCERTAINMENT METHOD

CROSS-REFERENCE TO RELATED APPLICATIONS

The present application claims priority to Japanese Patent Application No. 2013-256521, filed on Dec. 11, 2013, the content of which is hereby incorporated by reference in its entirety.

BACKGROUND

Technical Field

The present invention relates to a substrate holding device that holds a substrate using an electrostatic chuck. In addition, it relates to a semiconductor fabrication device provided with said substrate holding device, and to a substrate clamping ascertainment method using said substrate holding device.

Background Art

In the past, electrostatic chucks have been used to fixedly hold substrates in transport mechanisms and semiconductor fabrication devices.

If a substrate is not completely secured to an electrostatic chuck, this may lead to problems, i.e. the substrate may fall off the electrostatic chuck, develop cracks during substrate transportation or substrate processing, etc. For this reason, it is believed that when a substrate is secured to an electrostatic chuck, it is important for the substrate to be reliably clamped.

In the prior art, ascertainment as to whether a substrate has been clamped to an electrostatic chuck in a normal manner was based on a technique that involved, as described in Patent Document 1, measuring capacitance between the substrate and an electrode that formed part of the electrostatic chuck, and ascertaining the clamped state of the substrate based on the amount of change in the capacitance.

PRIOR ART DOCUMENTS

Patent Documents

[Patent Document 1]
Japanese Patent Application Publication No. H7-211768.

SUMMARY

Problems to be Solved by the Invention

Since the amount of change in the capacitance between the substrate and the electrode of the electrostatic chuck before and after substrate clamping is relatively large if the resistance of the substrate being handled is relatively small (in the case of an electrically conductive substrate consisting of silicon and the like), the conventional technique could easily ascertain whether the clamped state of the substrate was normal. Nowadays, however, there are numerous types of substrates being handled and in some cases electrostatic chucks are used to clamp high resistance (1E8-9 Ω·cm or higher) substrates and substrate with high insulating properties (e.g. glass substrates).

When such a substrate is handled, it is of course possible to ascertain the clamped state of the substrate in the same manner as before, in other words, based on the amount of change in the capacitance between the substrate and the electrode in the electrostatic chuck. However, with such a substrate, the amount of change in capacitance is a very small value of several pF, which makes it difficult to ascertain whether the substrate has been electrostatically clamped in a normal manner.

It is a primary object of the present invention to easily ascertain whether a substrate has been clamped by an electrostatic chuck in a normal manner regardless of the type of the substrate being handled.

Means for Solving the Problems

The inventive substrate holding device is provided with:
an electrostatic chuck that has an electrode therein and is provided with a substrate holding surface, on one side of which a substrate is held;
a displacement gauge that is disposed above or below the substrate holding surface; and
a controller which, along with using the displacement gauge to measure a first distance to the substrate when a substrate is placed on the substrate holding surface, uses the displacement gauge to measure a second distance to the substrate after a predetermined voltage is applied to the electrode of the electrostatic chuck and, based on the difference between the measured distances, ascertains whether the clamping of the substrate to the electrostatic chuck has been performed in a normal manner.

The displacement gauge, which is used for measuring the amount of substrate warpage and for positioning the substrate, is capable of measurement in μm units. If the substrate holding surface of the electrostatic chuck is a flat surface without irregularities and the backside of the substrate is also a flat surface without irregularities, then ideally there should be no gap between the substrate and the substrate holding surface of the electrostatic chuck. However, in practice, the surface of the substrate and the substrate holding surface of the electrostatic chuck are slightly deformed due to manufacturing errors or the usage environment, and a very small gap (on the order of several μm) is present between the two members. When the substrate is placed on the electrostatic chuck, the above-described gap is formed between the two members. However, once a predetermined voltage is applied to the electrode of the electrostatic chuck, an electrostatic clamping force is generated between the two members, and the substrate is pulled towards the substrate holding surface of the electrostatic chuck, thereby slightly changing the gap. In addition, when the substrate applies pressure to the substrate holding surface as a result of substrate clamping, a dielectric layer under the substrate holding surface is slightly compressed in a downward direction. As a result, the position of the substrate is further changed. In addition, if silicone rubber or other elastic materials are used in the electrostatic chuck, the amount of deformation of the electrostatic chuck due to the pressure applied by the substrate increases, and the change in the position of the substrate is further increased. With this point in mind, the displacement gauge is used to measure the distances to the substrate before and after the substrate clamping operation and the clamped state of the substrate to the electrostatic chuck is ascertained based on the difference between these distances. As a result, it becomes possible to easily ascertain whether a substrate has been clamped to an electrostatic chuck in a normal manner without relying on the electrical properties of the substrate.

More specifically, the above-mentioned controller is adapted to compare the difference between the first distance and the second distance with a predetermined first reference value and generate an error signal if it is smaller than said reference value.

If the controller is adapted to generate an error signal after detecting that the clamped state of the substrate is abnormal, countermeasures can be taken, such as stopping the subsequent processing.

The displacement gauge can be positioned as follows. The substrate is held in a state in which it partially protrudes from the substrate holding surface in a direction parallel to the substrate holding surface. Additionally, the displacement gauge is disposed in a location facing the portion of the substrate protruding from the substrate holding surface.

The clamping force of the electrostatic chuck acts directly on the portion of the substrate located on the substrate holding surface (central portion of the substrate). The portion of the substrate protruding from the substrate holding surface (peripheral portion of the substrate) is subject to considerable fluctuations as the central portion of the substrate placed on the substrate holding surface is pulled towards the substrate holding surface. In addition, since the movement of the central portion of the substrate is restricted by the substrate holding surface, the amount of its displacement is limited. However, since the peripheral portion of the substrate is not held on the substrate holding surface, the amount of its displacement increases. In this manner, placing the displacement gauge so as to measure the peripheral portion of the substrate subject to considerable fluctuations makes it possible to increase the accuracy of ascertainment as to whether the substrate has been clamped to the electrostatic chuck in a normal manner.

If the surface of the substrate is subjected to a certain processing, the displacement gauge will impede the processing of the substrate if it is positioned in a location above the surface of the substrate. While it is also conceivable to use a configuration in which the displacement gauge is moved during substrate processing in order to avoid impeding the processing of the substrate, providing a mechanism for moving the gauge makes the configuration of the device more complicated. For this reason, there may be cases in which it is desirable to dispose the displacement gauge below the substrate holding surface of the electrostatic chuck. However, in such a case, depending on the relationship between the dimensions of the substrate and the dimensions of the substrate holding surface of the electrostatic chuck, it may be difficult to perform measurements using the displacement gauge. Accordingly, in order to eliminate this type of problem, it is desirable to use the following configuration. A through-hole is formed in the electrostatic chuck in a direction substantially perpendicular to the substrate holding surface. Additionally, the displacement gauge is disposed in a location from which the backside of the substrate is visible through said through-hole.

Using a configuration in which a through-hole is provided in the electrostatic chuck and the distance to the substrate is measured by the displacement gauge through this hole makes it possible to measure the distance to the substrate regardless of the dimensions of the substrate even when the displacement gauge is disposed below the substrate holding surface.

When the substrate is unclamped from the electrostatic chuck, the presence of the residual clamping force creates a risk that the substrate will bounce off the chuck or develop cracks if an attempt to unclamp the substrate is made forcefully without due care. Considering the residual clamping force as a limiting factor during the substrate unclamping operation, it is desirable to use the following configuration when performing the substrate unclamping operation.

After stopping the application of voltage to the electrode of the electrostatic chuck during the operation of unclamping of the substrate from the substrate holding surface, the controller uses the displacement gauge to measure a third distance to the substrate, and, along with that, calculates a difference between the previously measured first distance and the third distance and, depending on the result of comparison between the calculated difference in distance and a predetermined second reference value, ascertains whether to proceed with the subsequent substrate unclamping operation.

In addition, if the above-described substrate holding device is used in a processing chamber used for a semiconductor fabrication device, it is desirable to use the following configuration. In a semiconductor fabrication device provided in a processing chamber, the controller uses the displacement gauge to measure the distance to the substrate during the processing of the substrate placed on the electrostatic chuck and stops the processing of the substrate if the amount of change in said distance exceeds a third reference value.

For certain reasons, the substrate clamping force exerted by the electrostatic chuck may fluctuate during the processing of the substrate. For example, if warpage is generated in the substrate due to temperature changes and the stress produced by this warpage exceeds the clamping force, there is a risk that the substrate will bounce off the chuck or develop cracks during processing. Since it is difficult to continue substrate processing in such a case, adopting the above-described configuration by taking such phenomena into consideration makes it possible to prevent faulty substrate processing in advance.

Furthermore, while in the above-described configuration the clamping of the substrate was ascertained by a controller, such ascertainment may be performed by an operator of the equipment. In such a case, the following ascertainment method is used. A substrate holding device, which is provided with an electrostatic chuck having an electrode therein and is provided with a substrate holding surface, on one side of which a substrate is held, and a displacement gauge disposed above or below the substrate holding surface, uses the displacement gauge to measure a first distance to the substrate when the substrate is placed on the substrate holding surface, and, at the same time, uses the displacement gauge to measure a second distance to the substrate after a voltage is applied to the electrode of the electrostatic chuck and, based on the difference between these distances, ascertains whether the clamping of the substrate to the electrostatic chuck has been performed in a normal manner.

Using such a technique makes it possible to obtain effects equivalent to the effects of the substrate holding device equipped with a controller.

Effects of the Invention

The position of a substrate placed on the substrate holding surface of the electrostatic chuck before and after the substrate clamping operation slightly changes. With this point in mind, the displacement gauge is used to measure the distances from said displacement gauge to the substrate before and after the substrate clamping operation and the clamped state of the substrate to the electrostatic chuck is ascertained based on the difference between these distances. As a result, it becomes possible to easily ascertain whether the substrate has been clamped to the electrostatic chuck in a normal manner without relying on the electrical properties of the substrate.

DETAILED DESCRIPTION

Figure 1:
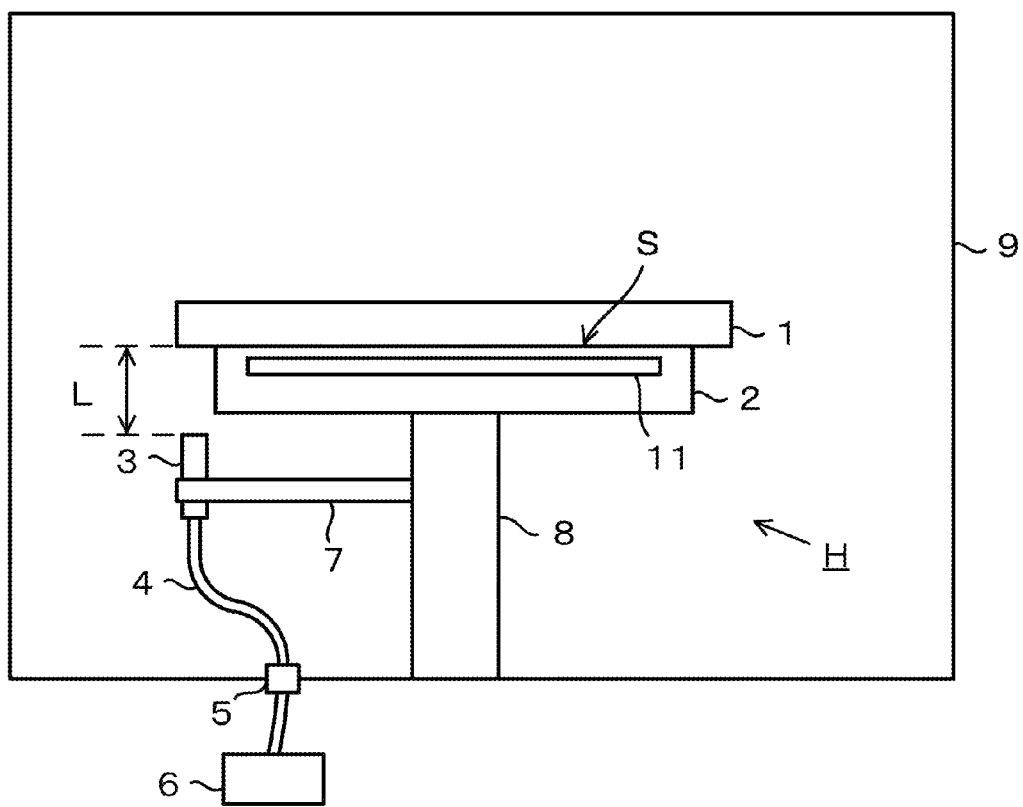
FIG. 1 A first working example of the inventive substrate holding device.

An example in which a substrate holding device H is disposed in the interior of a vacuum vessel 9 used in a semiconductor fabrication device is depicted in FIG. 1. Inside the electrostatic chuck 2, there is an electrode 11. A substrate holding surface S is formed therein, on one side of which a substrate 1 is placed. A predetermined voltage is applied to the electrode 11 by a power supply (not shown) as a result of which the substrate 1 is electrostatically clamped to the substrate holding surface S. Although a monopolar electrostatic chuck, which has only one electrode 11, is used in this example in order to simplify the explanation, other electrostatic chucks may be used as the electrostatic chuck 2 in this invention. For example, this may be a bipolar electrostatic chuck. In addition, although there is a very small gap between the substrate 1 and the substrate holding surface S, this gap is not shown in the drawing.

The electrostatic chuck 2 is supported on the floor of the vacuum vessel 9 by a holding mechanism 8. One end of a mounting fixture 7 is supported by this holding mechanism 8, while a sensor head 3 is supported at the other end of the mounting fixture 7. Optical fibers 4 connect this sensor head 3 to a light-source control unit 6 provided on the outside of the vacuum vessel 9. It should be noted that while the light-source control unit 6 may be placed inside the vacuum vessel 9, it should be placed on the outside the vacuum vessel 9, as shown in the drawing, if it is operated by an operator on the outside of the vessel. In such a case, the optical fibers 4 are routed in and out of the vacuum vessel 9 through a feed-through 5 provided in the wall of the vacuum vessel 9.

While there are various types of displacement gauges, such as a laser-type, a contact-type, or an eddy current-type, the displacement gauge of the present invention is a laser-type displacement gauge. Since this type of displacement gauge is well known in the art, a detailed discussion is omitted here. However, briefly stated, it has the following configuration.

Along with irradiating the object to be sensed with laser light from the light-source control unit 6 through the optical fibers 4, the sensor head 3 is provided with functionality to receive light reflected from the object to be sensed and return it to the light-source control unit 6 through the optical fibers 4. In addition, a reflective surface is provided at the distal end of the sensor head 3 and a portion of the light used to irradiate the object to be sensed is reflected from this reflective surface. The light-source control unit 6 takes spectrophotometric readings of the wavelengths of the light produced by the interference of the light reflected from the reflective surface of the sensor head 3 and the light reflected from the object to be sensed and subjects them to wavelength analysis, thereby calculating the distance from the sensor head 3 to the object to be sensed ("L" in the drawing).

Although what is typically called a displacement gauge is the assembly consisting of the above-described sensor head 3, optical fibers 4, and light-source control unit 6, in the present invention, it is the sensor head 3 used for measurements that is referred to as the displacement gauge.

The displacement gauge, which is used for measuring the amount of substrate warpage and positioning the substrate, is capable of measurement in μm units. If the substrate holding surface S of the electrostatic chuck 2 is a flat surface without irregularities and the back of the substrate 1 is also a flat surface without irregularities, then ideally there should be no gap between the substrate 1 and the substrate holding surface S of the electrostatic chuck 2. However, in practice, the surface of the substrate and the substrate holding surface S of the electrostatic chuck 2 are slightly deformed due to manufacturing errors or the usage environment, and a very small gap (on the order of several μm) is present between the two members.

When the substrate 1 is placed on the electrostatic chuck 2, the above-described gap is formed between the two members. However, after a predetermined voltage is applied to the electrode 11 of the electrostatic chuck 2, an electrostatic clamping force is generated between the two members, and the substrate 1 is pulled towards the substrate holding surface S of the electrostatic chuck 2, thereby slightly changing the gap. In addition, when the substrate 1 applies pressure to the substrate holding surface S when the substrate 1 is clamped, a dielectric layer under the substrate holding surface S is slightly compressed in a downward direction. As a result, the position of the substrate is further changed. In addition, if silicone rubber or other elastic materials are used in the electrostatic chuck 2, the amount of deformation of the electrostatic chuck due to the pressure applied by the substrate will increase, and the change in the position of the substrate will be further increased. With this point in mind, the displacement gauge is used to measure the distances from said displacement gauge to the substrate 1 before and after the substrate clamping operation and the clamped state of the substrate 1 to the electrostatic chuck 2 is ascertained based on the difference between these distances. As a result, it becomes possible to easily ascertain whether the substrate 1 has been clamped to the electrostatic chuck 2 in a normal manner without relying on the electrical properties of the substrate 1. The ascertainment method will be explained specifically with reference to FIG. 2.

Figure 2:
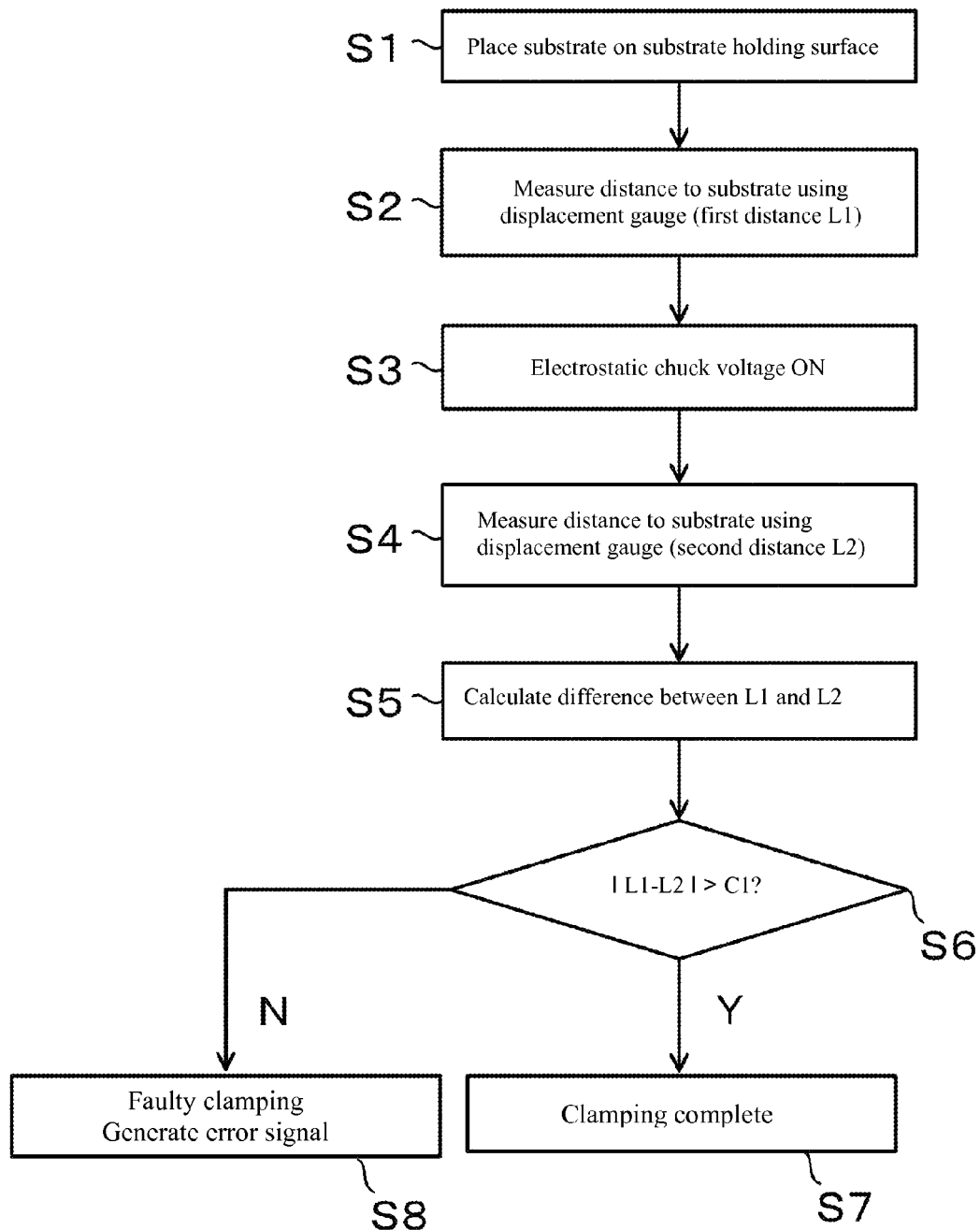
FIG. 2 A flow chart describing substrate clamping ascertainment during a clamping operation.

FIG. 2 shows a flow chart describing substrate clamping ascertainment during a clamping operation. First, in S1, a substrate 1 is placed on the substrate holding surface S. Next, in S2, before a predetermined voltage is applied to the electrode 11 of the electrostatic chuck 2, the distance to the substrate 1 is measured using the displacement gauge. In the present invention, the distance measured at this point is referred to as the first distance L1. It should be noted that the distance measured here is the distance between the displacement gauge and the substrate 1. The rest of the working examples described below are similar in this respect.

After measuring the first distance L1, in S3, a predetermined voltage is applied to the electrode 11 of the electrostatic chuck 2. The voltage level applied at such time, i.e. the voltage level used when clamping the substrate 1 to the electrostatic chuck 2, is determined in advance in accordance with the type of the clamped substrate 1 and the configuration of the electrostatic chuck 2.

After the predetermined voltage is applied and the substrate 1 is clamped to the electrostatic chuck 2, in S4, the displacement gauge is used again to measure the distance to the substrate 1. In the present invention, the distance measured at this point is referred to as the second distance L2. It should be noted that at this stage no ascertainment has been performed as to whether the substrate 1 has been clamped to the electrostatic chuck 2 in a normal manner. Since the substrate 1 is usually clamped to the electrostatic chuck 2 upon passage of several seconds after the application of the predetermined voltage, the time period required for completion of the clamping operation is obtained by performing tests etc. in advance, and the measurements of S4 are carried out after that time period has elapsed.

After the measurements in S4, a difference between the first distance L1 and the second distance L2 is calculated in S5. Subsequently, in S6, a preset first reference value C1 is compared with the difference in distance calculated in S5 and if the difference in distance is greater than said reference value, in S7 it is ascertained that the substrate 1 has been properly clamped to the electrostatic chuck 2 and the substrate clamping operation is finished. On the other hand, if the difference in distance calculated in S5 is equal or less than said reference value, in S8 it is ascertained that the clamping is faulty, and an error signal is generated. It should be noted that the operations of calculation in S5, comparison in S6, and ascertainment in S7 and S8 may be performed by the light-source control unit 6. In addition, a controller other than the light-source control unit 6 may be provided and this controller may be used to perform these operations. In such a case, the equipment should be configured to send the values measured by the light-source control unit 6 to the separately provided controller. In addition, the difference between the first distance L1 and the second distance L2 is expressed as a magnitude (absolute value). This is due to the fact that, depending on the shape of the substrate holding surface S of to electrostatic chuck 2 and the substrate 1, the second distance L2 may be greater than the first distance L1.

Figure 3:
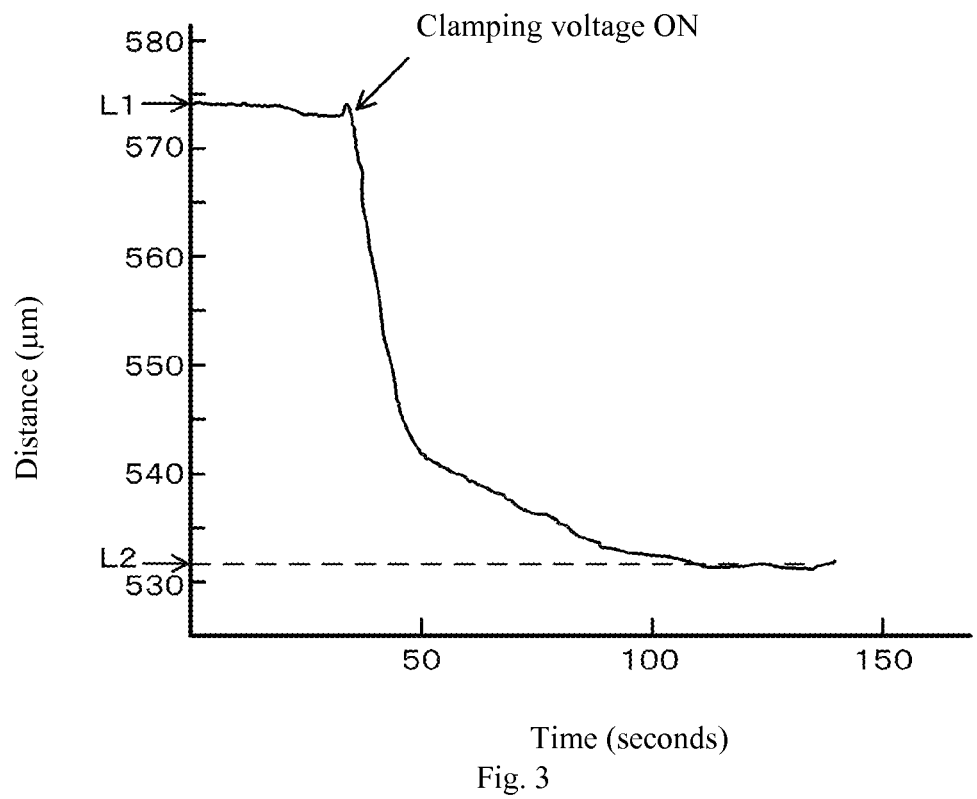
FIG. 3 Test data showing how the distance in the peripheral portion of the substrate changes due to the electrostatic clamping force.
Figure 5:
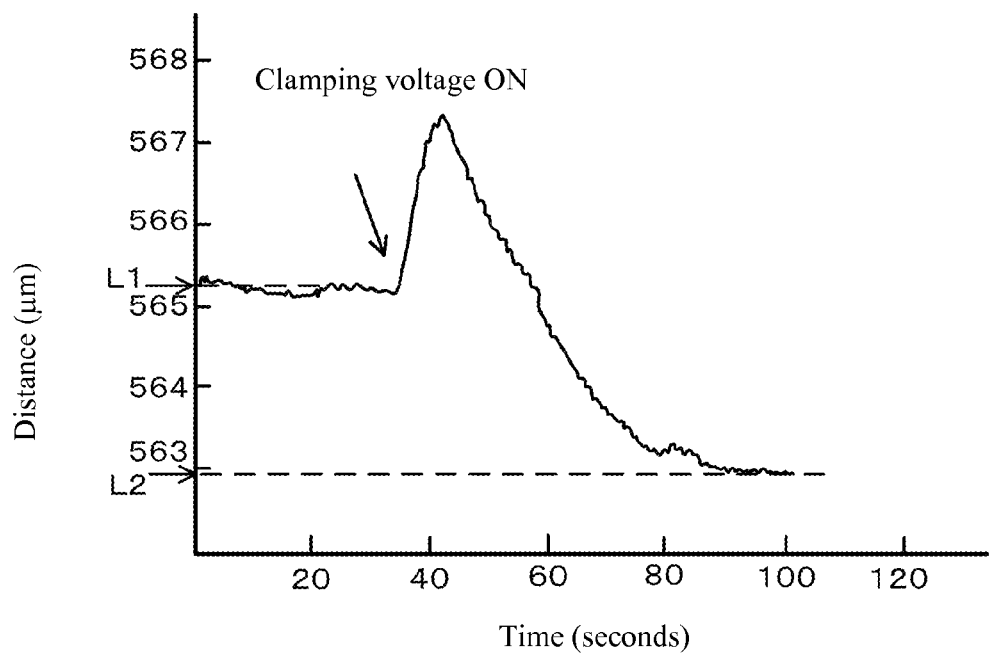
FIG. 5 Test data showing how the distance in the central portion of the substrate changes due to the electrostatic clamping force.

FIG. 3 illustrates test data obtained when the peripheral portion of a 4-inch silicon carbide substrate with a resistivity of 1E10 Ω·cm was measured using a displacement gauge from above the substrate. According to this test data, the distance to the substrate was approximately 574 μm (L1 in the figure) when the substrate 1 was placed on the substrate holding surface S of the electrostatic chuck 2, but this distance changed to approximately 532 μm (L2 in the figure) when a predetermined voltage was applied to the electrode 11 of the electrostatic chuck 2 and the clamping operation was finished. Currently commercially available displacement gauges are capable of measurement in 0.1-μm units and there are more accurate gauges that are capable of measurement in 0.01-μm units. Therefore, it can be appreciated that the amount of displacement of the substrate 1 between a pre- and post-clamping positions, as seen in the test data, can be sufficiently measured by displacement gauges. It should be noted that the distance to the substrate measured here is not the actual distance between the displacement gauge and the substrate 1. This is due to the fact that the scale plotted along the vertical axis of the test data of FIG. 3 contains a predetermined offset. The hereinafter described test data illustrated in FIG. 5 is similar in this respect.

In the working example of FIG. 1, the substrate 1 is held by the electrostatic chuck 2 in a state in which it partially protrudes from the substrate holding surface S in a direction parallel to the substrate holding surface S, and a displacement gauge (sensor head 3) is disposed in a location facing the portion of the substrate 1 that protrudes from the substrate holding surface S.

The clamping force exerted by the electrostatic chuck 2 acts directly on the central portion of the substrate on the substrate holding surface S. The peripheral portion of the substrate protruding from the substrate holding surface S is subject to considerable fluctuations as the central portion of the substrate placed on the substrate holding surface S is pulled towards the substrate holding surface S. In addition, since the movement of the central portion of the substrate is restricted by the substrate holding surface S, the amount of its displacement is limited. However, since the peripheral portion of the substrate is not held on the substrate holding surface S, the amount of its displacement increases.

For this reason, placing the displacement gauge (sensor head 3) so as to measure the peripheral portion of the substrate subject to relatively significant fluctuations makes it possible to increase the accuracy of ascertainment as to whether the substrate 1 has been clamped to the electrostatic chuck 2 in a normal manner. It should be noted that while the displacement gauge was disposed below the substrate holding surface S in the working example of FIG. 1, it also may be disposed above the substrate holding surface S. However, if the surface of the substrate 1 held by the electrostatic chuck 2 is subjected to ion implantation or other processing, placing the displacement gauge above the substrate holding surface S during the processing of the substrate 1 makes normal processing of the substrate 1 impossible. In such cases, the displacement gauge is disposed below the substrate holding surface S. Alternatively, it is conceivable to dispose the displacement gauge above the substrate holding surface S and provide a mechanism that moves the displacement gauge to a position where it will not impede the processing of the substrate before the substrate 1 is subjected to processing.

In addition, if the displacement gauge is disposed below the substrate holding surface S of the electrostatic chuck 2, then, depending on the dimensional relationship between the substrate 1 and the substrate holding surface S of the electrostatic chuck 2, it may be difficult to perform measurements using the displacement gauge. Specifically, if the dimensions of the substrate 1 are smaller than the dimensions of the substrate holding surface S, the substrate 1 is not visible from underneath the substrate holding surface S, so unless special means are provided, the displacement gauge cannot be used to measure the distance to the substrate 1. In such a case, it is contemplated to use the configuration described in FIG. 4.

Figure 4:
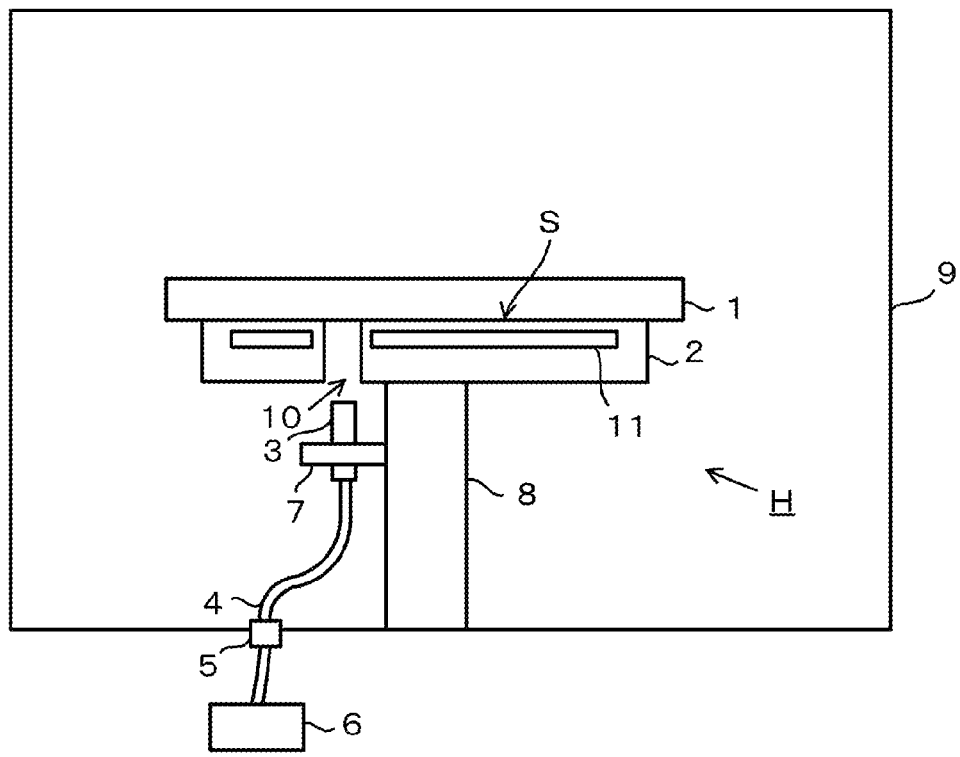
FIG. 4 A second working example of the inventive substrate holding device.

FIG. 4 depicts a second working example of the inventive substrate holding device H. The difference from the configuration of FIG. 1 is that a through-hole 10 is formed in the electrostatic chuck 2 in a direction substantially perpendicular to the substrate holding surface S and the displacement gauge (sensor head 3) is disposed in a location from which the backside of the substrate 1 is visible through this through-hole 10. It should be noted that the through-hole 10 is formed such that the electrode 11 provided in the electrostatic chuck 2 is avoided. In addition, the term "substantially perpendicular" means including the direction that is perpendicularly related to the substrate holding surface S and also including directions slightly deviating from this direction. This refers to being able to see the backside of the substrate through the through-hole 10 even if the through-hole 10 is not necessarily formed in a direction perpendicular to the substrate holding surface S because of the thickness of the electrostatic chuck 2.

Although the amount of displacement of the substrate 1 before and after the electrostatic clamping operation in the central portion of the substrate is smaller in comparison with the peripheral portion of the substrate, the experiments of the presently named inventors have confirmed it to be on the order of several μm. FIG. 5 illustrates test data obtained by measuring the amount of displacement in the central portion of the substrate. The substrate under measurement was identical to the substrate used in the test data of FIG. 3. According to the test data of FIG. 5, the difference between the first distance L1 and the second distance L2 was about 2 μm. The measurement accuracy of the displacement gauge allows even such small fluctuations to be readily handled, which makes it possible to measure the displacement in the central portion of the substrate using the configuration described in FIG. 4 and perform clamping ascertainment.

Figure 6:
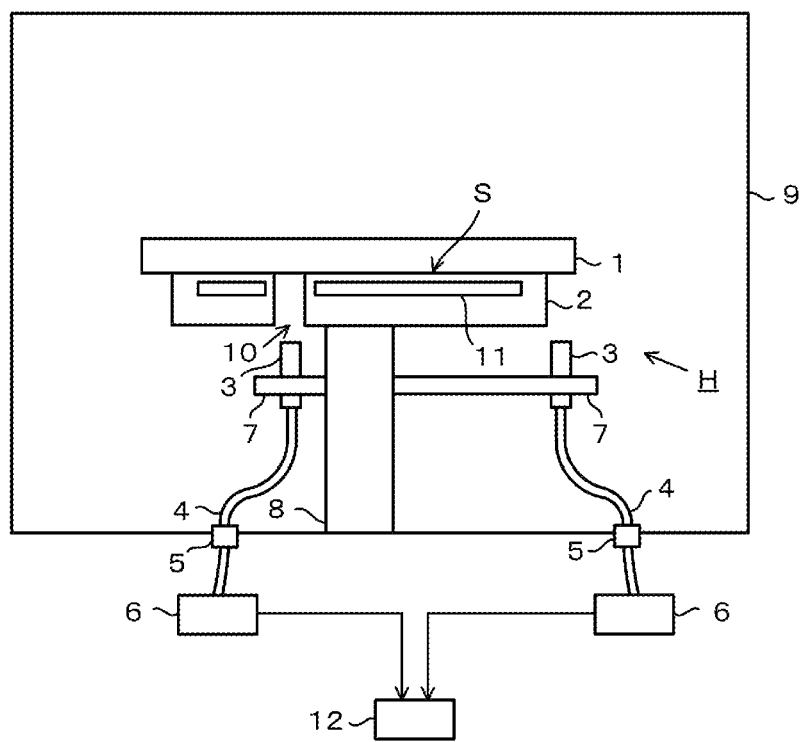
FIG. 6 A third working example of the inventive substrate holding device.

Although in the working examples of FIG. 1 and FIG. 4 the number of displacement gauges was one, the inventive configuration is not limited to this number. Multiple displacement gauges may be provided, as depicted in FIG. 6. For example, in FIG. 6, the displacement gauges are disposed in locations respectively corresponding to the central portion of the substrate and the peripheral portion of the substrate. With the displacement gauges disposed in this manner, measured values are separately sent from power supply control units 6 to a single controller 12. The measured values sent from the power supply control units 6 are compared with a specific predetermined reference value and if the measured values in both power supply control units 6 meet the requirements, it may be ascertained that normal clamping has been performed. Using such a configuration can improve the accuracy of clamping ascertainment.

In addition, if multiple displacement gauges are provided, the displacement gauges do not necessarily have to be disposed in locations corresponding respectively to the central portion of the substrate and the peripheral portion of the substrate, as depicted in FIG. 6. For example, the displacement gauges may be disposed closer to one location. However, it is believed that the clamped state of the substrate 1 varies slightly depending on its location relative to the shape of the substrate holding surface S and substrate 1. Therefore, it is better to provide multiple displacement gauges in locations that are slightly spaced apart rather than in adjacent locations. For example, it is believed that if multiple gauges are disposed in the peripheral portion of the substrate, the multiple displacement gauges should be disposed symmetrically about the center of the substrate 1.

Depending on the process used in the semiconductor fabrication device, the surface of the substrate is processed while the substrate 1 is moved in the interior of the vacuum vessel 9. In such a case, the holding mechanism 8 serves as a mechanism used for moving the electrostatic chuck 2. However, a situation is conceivable in which, depending on the direction of travel of this mechanism, the optical fibers 4 might be wound around the holding mechanism 8 and impede the movement of the holding mechanism 8. In such a case, it is conceivable for the optical fibers 4 to get twisted and be broken. The configuration illustrated in FIG. 7 can be used in order to avoid such problems. It should be noted that the vacuum vessel 9 corresponds to a processing chamber used as a room for processing the substrate 1 in the semiconductor fabrication device.

Figure 7:
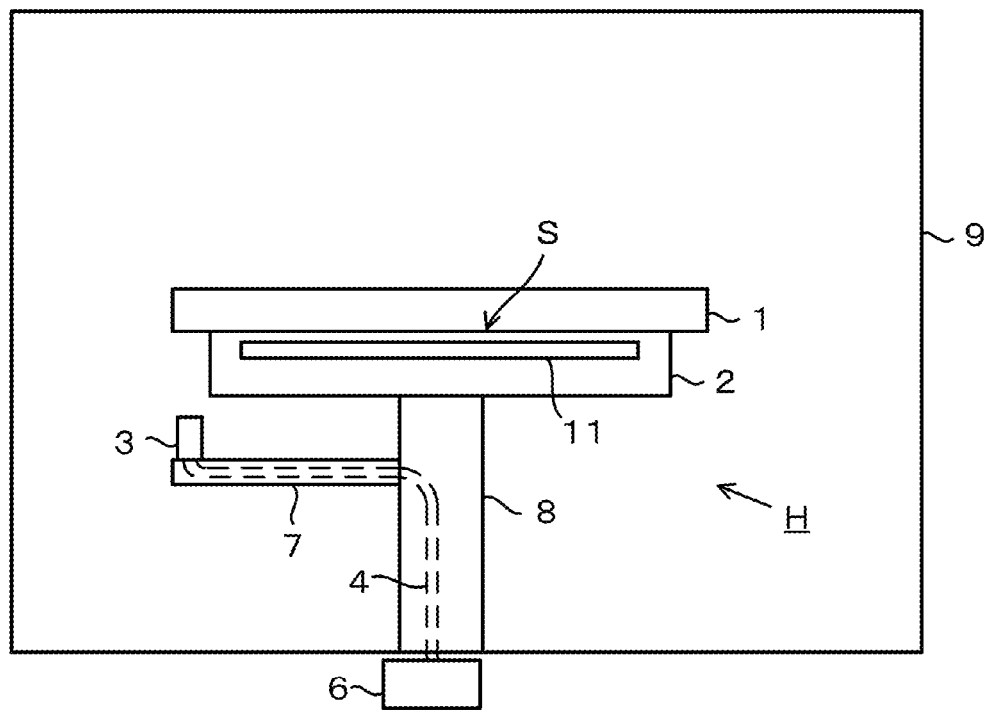
FIG. 7 A fourth working example of the inventive substrate holding device.

FIG. 7 depicts a fourth working example of the inventive substrate holding device H. In this working example, the holding mechanism 8 supports the electrostatic chuck 2 and a mechanism is contemplated for moving it. The interior portion of this holding mechanism 8 is hollowed out and the optical fibers 4 are adapted to be routed therethrough. In addition, as shown in the drawing, a configuration can be used in which the interior portion of the mounting fixture 7 is also hollowed out and the optical fibers 4 are adapted to be routed therethrough in the same manner as the holding mechanism 8. If such a configuration is used, the optical fibers 4 may be prevented from getting wound around the holding mechanism 8 even if the electrostatic chuck 2 is adapted to be moved by the holding mechanism 8.

In addition, even if the holding mechanism 8 is not adapted to move, some kind of transport mechanism used to transport the substrate 1 to the electrostatic chuck 2 is very likely to be present in the interior of the vacuum vessel 9. The optical fibers 4 may conceivably get wound around such a transport mechanism. In addition, even if the optical fibers 4 do not get wound around it, there is a risk that the way the optical fibers 4 are routed may decrease the degree of freedom in the placement of the transport mechanism. In order to eliminate such problems even if the holding mechanism 8 does not move, the interior portion of said mechanism may be hollowed out and the optical fibers 4 may be routed therethrough. It should be noted that if movement of the holding mechanism 8 causes the optical fibers 4 to move, the length of the optical fibers 4 should be increased to allow for the movement of the holding mechanism 8.

Although in the configurations of the previous working examples the mounting fixture 7 was supported by the holding mechanism 8, the inventive configurations are not limited thereto. For example, the configurations depicted in FIG. 8 and FIG. 9 may be used.

Figure 8:
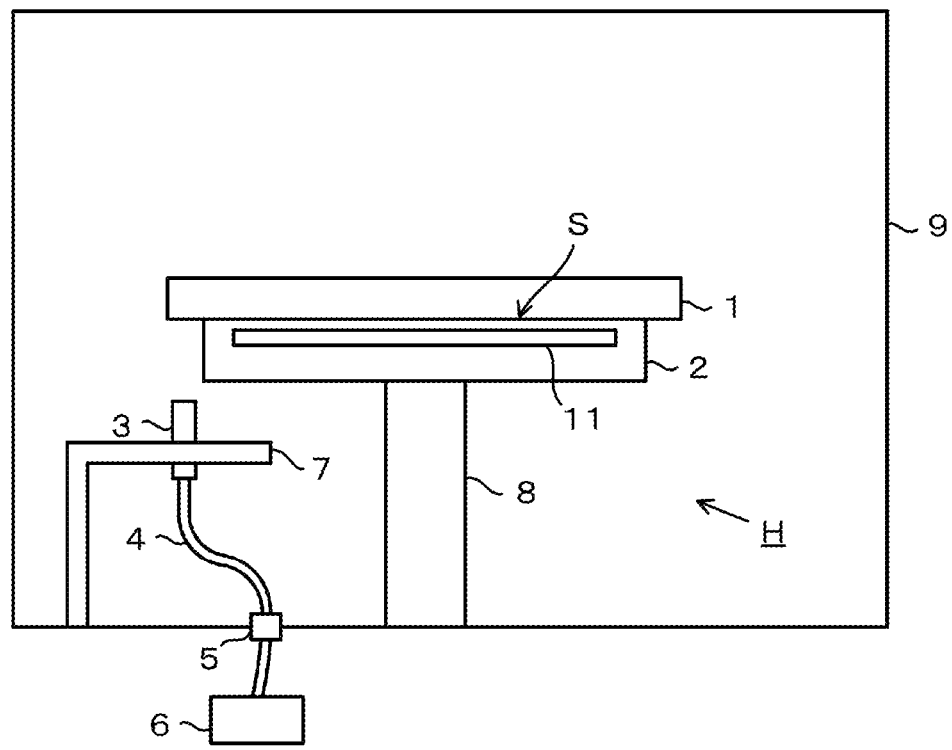
FIG. 8 A fifth working example of the inventive substrate holding device.
Figure 9:
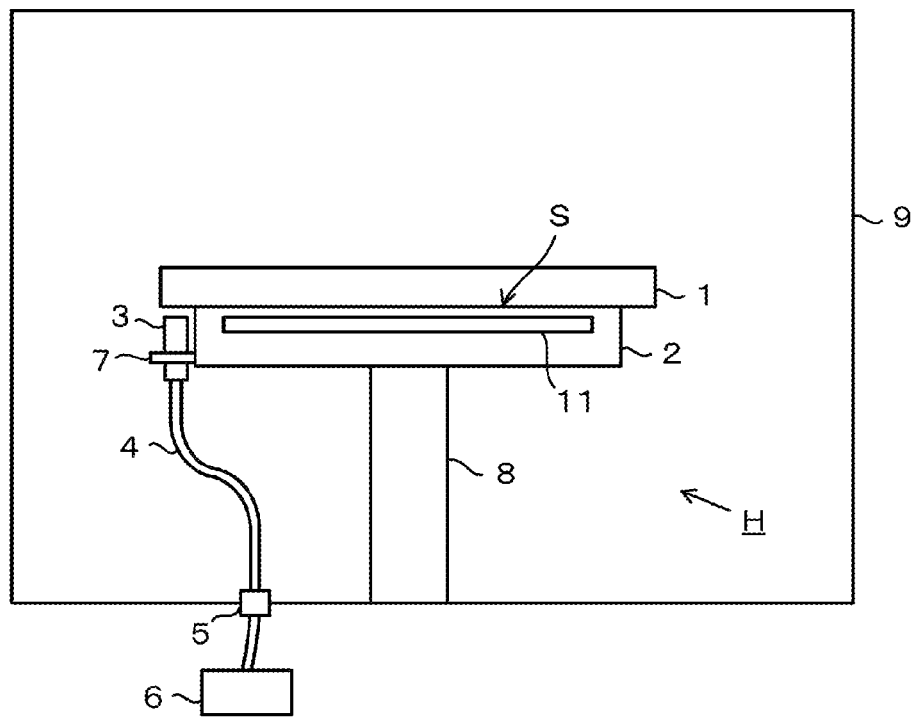
FIG. 9 A sixth working example of the inventive substrate holding device.

In the working example of FIG. 8, the mounting fixture 7 is supported on the floor of the vacuum vessel 9. In addition, in the working example of FIG. 9, the mounting fixture 7 is supported by the electrostatic chuck 2. Furthermore, the mounting fixture 7 may be supported on a side wall of the vacuum vessel 9 (not shown). However, since the effective measurement distance of the displacement gauges is short (on the order of several cm (about 2 to 5 cm)), measurement using displacement gauges may become impossible if the distance between the sensor head 3 and the substrate 1 is excessively increased. With this point in mind, the sensor head 3 is disposed in the immediate vicinity of the substrate 1 under measurement.

Although the previous working examples have described exemplary configurations in which the electrostatic chuck 2 was disposed in the interior of the vacuum vessel 9, the present invention is not limited thereto. For example, the electrostatic chuck 2 may be used at the distal end of an arm of a transport mechanism used to transport substrates in atmosphere. Exemplary configurations used in such cases are depicted in FIG. 10 and FIG. 11.

Figure 10:
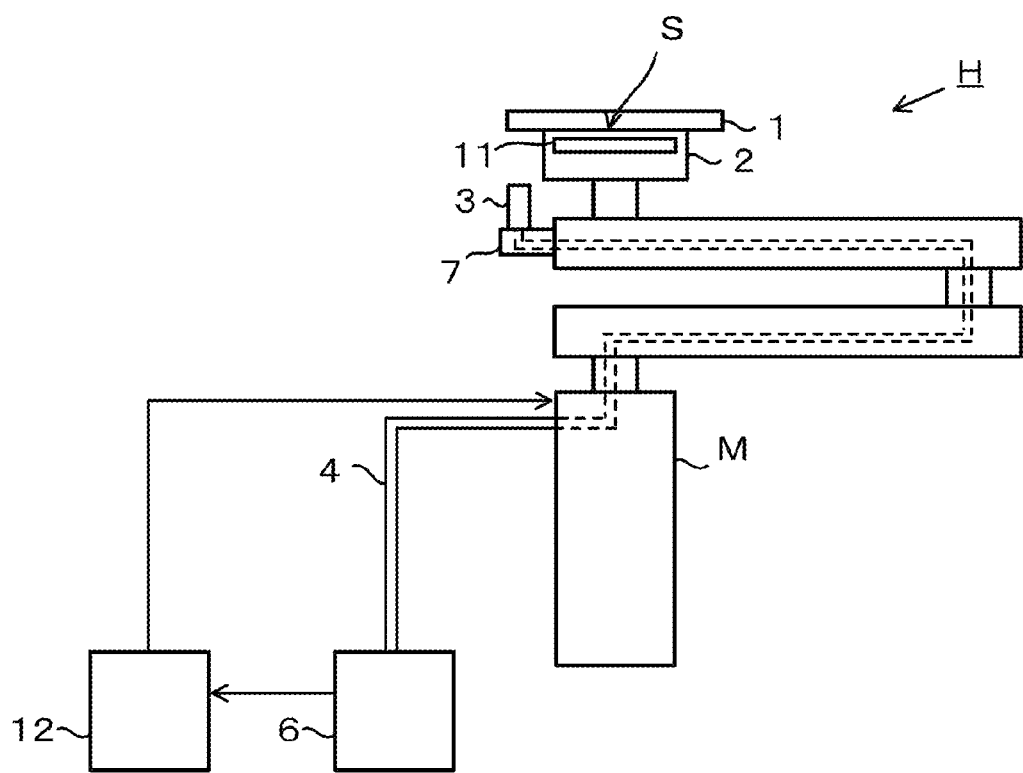
FIG. 10 A seventh working example of the inventive substrate holding device.
Figure 11:
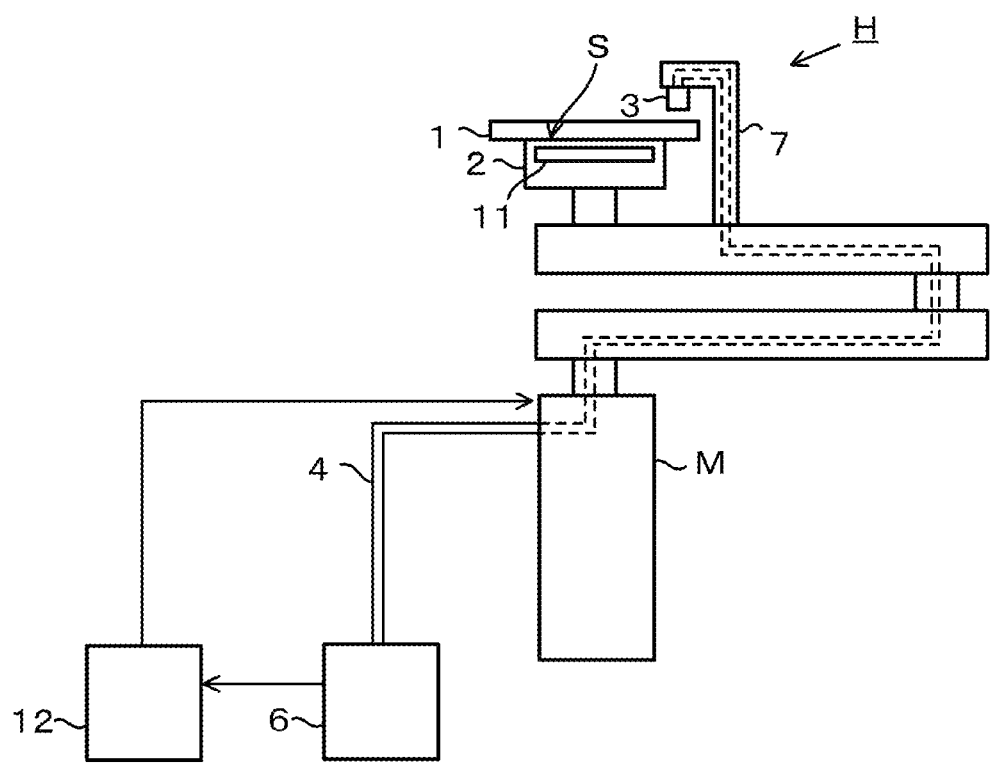
FIG. 11 An eighth working example of the inventive substrate holding device.

The transport mechanisms depicted in FIG. 10 and FIG. 11 have an electrostatic chuck 2 attached to the distal end of a multi-linked mechanism that is moved by a motor or another drive source M. In the configuration of FIG. 10, the optical fibers 4 are placed such that they are routed through the interior of the transport mechanism and the amount of displacement of the substrate 1 is measured from underneath the substrate 1. Conversely, in the configuration of FIG. 11, the amount of displacement of the substrate 1 is measured from above the substrate 1. In addition, as shown in the drawing, a configuration may be used in which an error signal is sent to the controller 12 controlling the drive source M if the light-source control unit 6 ascertains that clamping is faulty, and said controller 12 stops the transport of the substrate 1 by the drive source M.

As depicted in these drawings, the present invention is applicable to transport mechanisms used for substrate transport in atmosphere. It should be noted that while FIG. 10 and FIG. 11 depict configurations in which the optical fibers 4 are routed through the interior of the transport mechanism, the configurations of the present invention are not limited to such configurations.

Normally, substrates are transferred onto the transport mechanism in the same position. If the clamped state is not constantly monitored during the transport of the substrate 1, the displacement gauge should be disposed such that the clamped state of the substrate 1 can be monitored at the location of the transfer position. In such a case, the displacement gauge is fixedly supported in a specific location using a supporting member in a position where it does not impede the transport of the substrate by the transport mechanism. It is adapted to perform substrate clamping ascertainment by measuring the amount of displacement of the substrate 1 before and after the clamping operation, which is performed before transport begins. At such time, the optical fibers 4 are placed in a location outside the transport mechanism where they do not impede transport by the transport mechanism.

Although the previous working examples have described examples in which substrate clamping ascertainment was performed when the substrate 1 was clamped, the timing of substrate clamping ascertainment is not limited thereto. When the substrate 1 is unclamped from the electrostatic chuck 2, the presence of the residual clamping force creates a risk that the substrate 1 will bounce off the chuck or develop cracks if an attempt to unclamp the substrate 1 with lift pins is made forcefully without due care. Taking the residual clamping force, which is a limiting factor in the operation of unclamping of the substrate 1, into account makes it possible to use the present invention during the operation of unclamping of the substrate 1.

In addition, even if the clamped state is normal at the start of clamping, the clamped state of the substrate 1 may change while the substrate undergoes certain processing (substrate transport or semiconductor processing on the substrate, etc.). For example, if warpage is generated in the substrate due to temperature changes and the stress produced by this warpage exceeds the clamping force, there is a risk that the substrate will bounce off the chuck or develop cracks during processing. The present invention can be used during such substrate processing.

Figure 12:
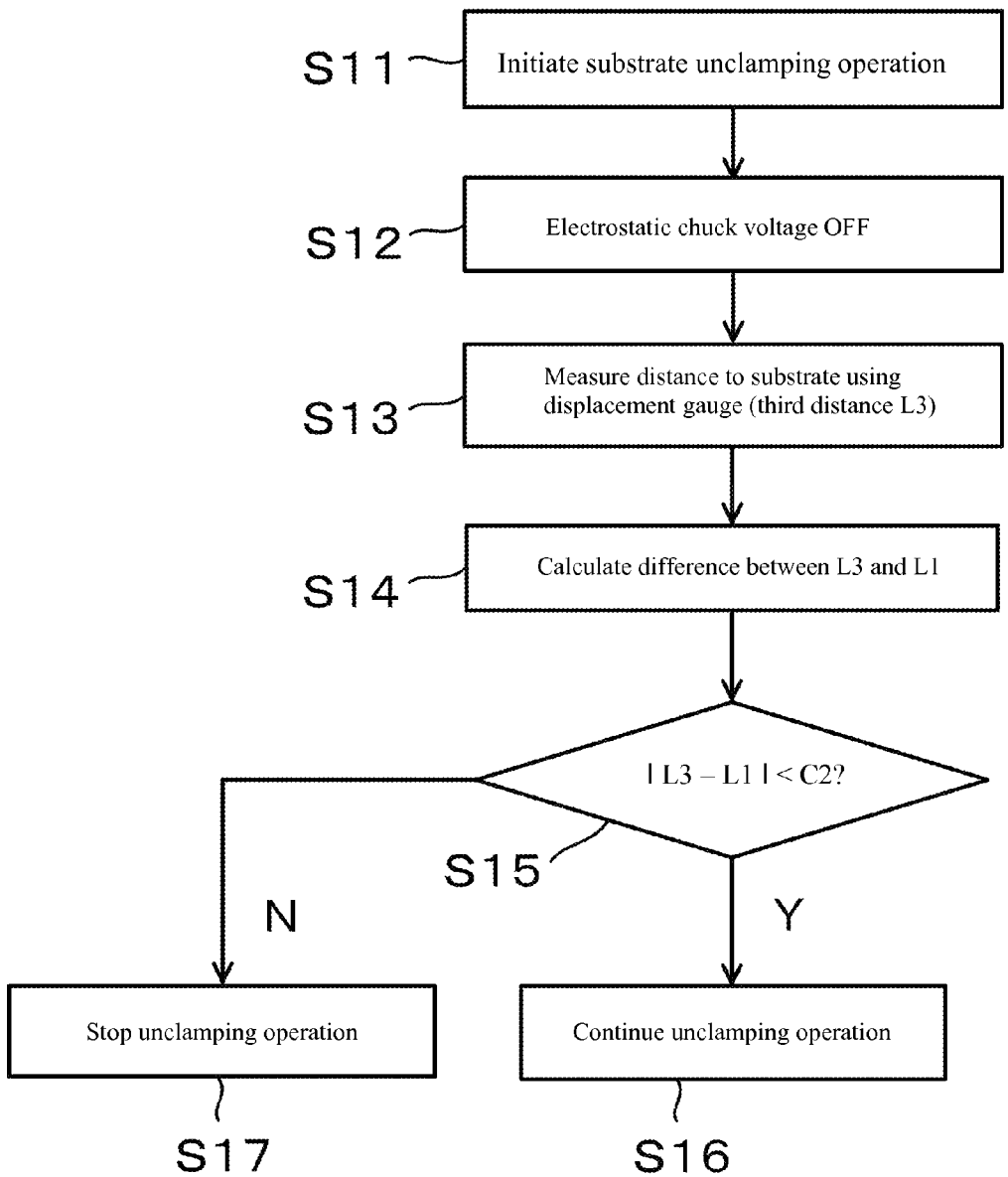
FIG. 12 A flow chart describing substrate clamping ascertainment during an unclamping operation.
Figure 13:
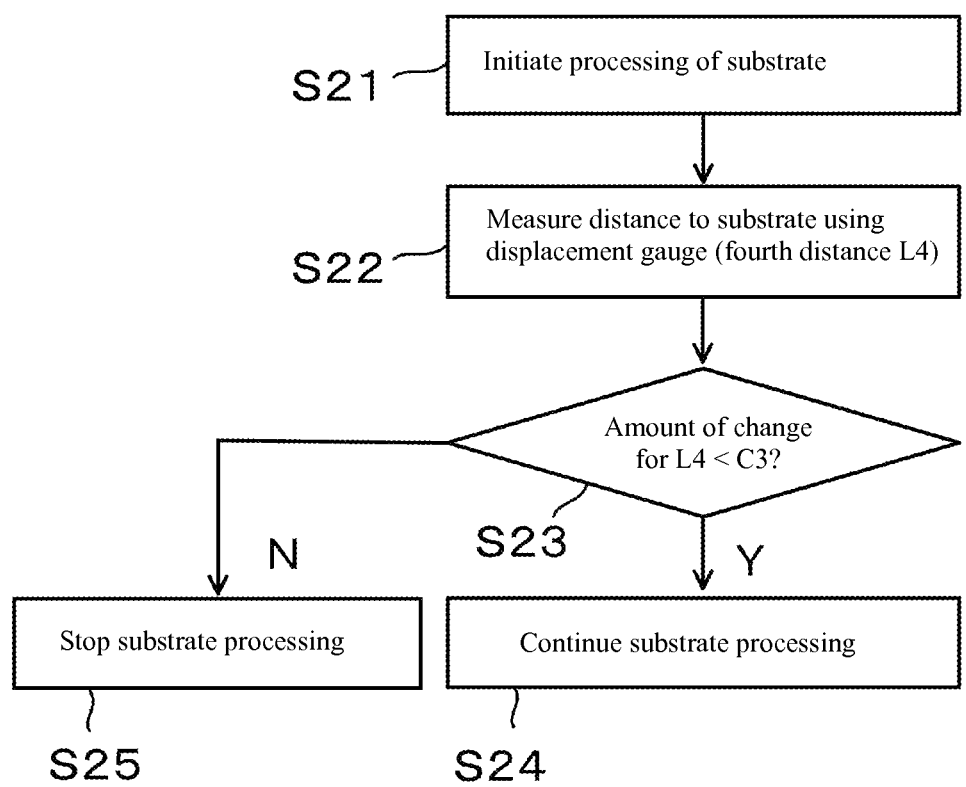
FIG. 13 A flow chart describing a technique for monitoring the clamped state of a substrate during substrate processing.

FIG. 12 and FIG. 13 will be used to explain how the inventive substrate clamping ascertainment is used when substrates are unclamped and subject to processing.

FIG. 12 shows a flow chart describing the technique of substrate clamping ascertainment during substrate unclamping. The substrate 1 has been electrostatically clamped to the substrate holding surface S of the electrostatic chuck 2 and the processing of the substrate 1 is complete. At first, an operation of unclamping the substrate 1 is initiated in S11. Next, the application of voltage to the electrode 11 of the electrostatic chuck 2 is stopped in S12. It should be noted that voltage of opposite polarity from that which was applied during electrostatic clamping may be applied to the electrode 11 before stopping the application of voltage in order to reduce the residual clamping force. In addition, voltages of opposite polarity may also be applied in stages. Finally, when the substrate 1 is lifted from the electrostatic chuck 2, the voltage level applied to the electrode 11 becomes zero.

After stopping the application of voltage to the electrode 11, the distance to the substrate 1 is measured by the displacement gauge in S13. In the present invention, this distance is referred to as the third distance L3. Subsequently, in S14, a difference is calculated between the third distance L3 and the first distance L1, which was measured before initiating the electrostatic clamping operation. It should be noted that the first distance L1, which was measured in advance, is stored in a power supply control unit 6 or another controller and is adapted to be read out when calculating the difference from the third distance L3.

In S15, a comparison is performed between the calculated difference (magnitude) and a second reference value C2 pre-stored in a power supply control unit 6 or another controller. If the value calculated in S14 is smaller than the second reference value C2, the unclamping operation is continued in S16. It should be noted that the specific processing performed starting from S16 is an operation, whereby the substrate 1 is lifted from the substrate holding surface S of the electrostatic chuck 2 using lifting pins.

On the other hand, if the value calculated in S14 is equal to, or greater than, the second reference value C2, the unclamping operation is stopped in S17. Residual clamping force decreases with the passage of time. If the unclamping operation is stopped in S17, this fact may be used and the routine may go back to S13 to measure the third distance L3 again. Once again, a difference between the re-measured third distance L3 and the first distance L1 is calculated and a comparison with the second reference value C2 is performed. Here, it is contemplated to use a configuration in which the unclamping operation is completely stopped in S17 if the value re-calculated in S14 is equal to, or greater than, the second reference value C2, and the operator of the device is notified of the abnormality in the unclamping operation by sounding a warning tone or displaying a warning message on the operation screen of the device.

FIG. 13 shows a flow chart describing the technique of monitoring the clamped state of the substrate during substrate processing. Processing of the substrate 1 is initiated in S21. This processing consists of transporting the substrate 1 or subjecting the substrate 1 to semiconductor processing and the like. Next, a distance to the substrate 1 is measured in S22. In the present invention, this distance is referred to as the fourth distance L4. This measurement is carried out several times at predetermined time intervals or continuously while the processing of the substrate 1 proceeds.

In S23, along with calculating the amount of change in the fourth distance L4 during the processing of the substrate 1, a comparison is performed between said amount of change and a pre-determined third reference value C3. If the amount of change in the fourth distance L4 is smaller than the third reference value C3, substrate processing is continued in S24. On the other hand, if the amount of change in the fourth distance L4 is equal to, or greater than, the third reference value C3, substrate processing is stopped in S25.

Using such a configuration makes it possible to prevent processing failures that may occur when the substrate bounces off the chuck or develops cracks during substrate processing.

OTHER WORKING EXAMPLES

Although in the above-described working examples the ascertainment of substrate clamping was carried out automatically using the light-source control units 6 or other controllers 12, etc., substrate clamping ascertainment may be performed based on decisions made by the operator of the device. For example, a display is provided and the values measured by the displacement gauge are displayed thereon. By comparing the displayed measured values with the predetermined reference values, the operator of the device may perform operator-based clamping ascertainment and take measures, such as stopping the operating device, etc. In addition, if the light-source control units 6 are imparted with functionality for displaying measurement data, there is no need to specially provide the above-mentioned display.

Although the first distance L1, second distance L2, and third distance L3 in the above-described working examples were described as distances obtained by measurements conducted by the displacement gauge at specific points in time, a configuration may also be used in which measurements by the displacement gauge are carried out on a continuous basis and the measured values used for clamping ascertainment are extracted from data measured in real time.

Furthermore, the first reference value C1, second reference value C2, and third reference value C3 may be either different values or identical values.

In addition, use of the present invention also provides for detection of cracking in the substrate 1 during clamping. If cracking occurs in the substrate 1 during clamping, small changes occur in the attitude of the substrate 1 on the substrate holding surface S. Since such changes can be confirmed by displacement gauge measurements, use of the present invention also enables detection of cracking in the substrate 1.

Other than as described above, various other improvements and modifications may of course be made without departing from the main concept of the invention.

DESCRIPTION OF THE REFERENCE NUMERALS

1 Substrate
2 Electrostatic chuck
3 Sensor head (displacement gauge)
4 Optical fibers
5 Feed-through
6 Power supply control unit
7 Mounting fixture
8 Holding mechanism
9 Vacuum vessel
10 Through-hole
11 Electrode
12 Controller
H Substrate holding device
S Substrate holding surface

The invention claimed is:

1. A substrate holding device provided with:
an electrostatic chuck that has an electrode therein and is provided with a substrate holding surface, on one side of which a substrate is held;
a displacement gauge that is disposed above or below the substrate holding surface; and
a controller which uses the displacement gauge to measure a first distance to the substrate before a clamping operation when a substrate is placed on the substrate holding surface, and uses the displacement gauge to measure a second distance to the substrate after the clamping operation and a predetermined voltage is applied to the electrode of the electrostatic chuck and, based on the difference between the measured distances before the clamping operation and the predetermined voltage is applied, and after the clamping operation, ascertains whether the clamping operation of the substrate to the electrostatic chuck has been performed in a normal manner without relying on electrical properties of the substrate, wherein the clamping operation comprises,
performing a first measurement associated with the first distance, wherein the first measurement is performed when the first distance remains constant;
applying the predetermined voltage to the electrode of the electrostatic chuck;
and
performing a second measurement associated with the second distance, wherein the second measurement is performed when the second distance remains constant.

2. The substrate holding device according to claim 1, wherein the controller compares the difference between the first distance and second distance with a predetermined reference value and generates an error signal if the difference is smaller than said reference value.

3. The substrate holding device according to claim 1, wherein the substrate is held in a state in which the substrate partially protrudes from the substrate holding surface in a direction parallel to the substrate holding surface, and further, the displacement gauge is disposed in a location facing the portion of the substrate protruding from the substrate holding surface.

4. The substrate holding device according to claim 1, wherein a through-hole is formed in the electrostatic chuck in a direction substantially perpendicular to the substrate holding surface, and further, the displacement gauge is disposed in a location, from which the backside of the substrate is visible through said through-hole.

5. The substrate holding device according to claim 1, wherein the controller, after stopping the application of voltage to the electrode of the electrostatic chuck during an operation of unclamping of the substrate from the substrate holding surface, uses the displacement gauge to measure a third distance to the substrate, and, calculates a difference between the previously measured first distance and the third distance and, depending on the result of comparison between the calculated difference in distance and a predetermined reference value, ascertains whether to proceed with a subsequent substrate unclamping operation.

6. A semiconductor fabrication device provided with the substrate holding device according to claim 1 in a processing chamber, wherein the displacement gauge is disposed below the substrate holding surface, and the controller uses the displacement gauge to measure a distance to the substrate during the processing of the substrate held on the electrostatic chuck, and stops the processing of the substrate if the amount of change in said distance exceeds a predetermined reference value.

7. A substrate clamping ascertainment method wherein a substrate holding device provided with an electrostatic chuck having an electrode therein and provided with a substrate holding surface, on one side of which a substrate is held, and a displacement gauge disposed above or below the substrate holding surface, uses the displacement gauge to measure a first distance to the substrate before a clamping operation when a substrate is placed on the substrate holding surface, and, further, uses the displacement gauge to measure a second distance to the substrate after the clamping operation and a voltage is applied to the electrode of the electrostatic chuck and, based on the difference between these distances before the clamping operation and the predetermined voltage is applied, and after the clamping operation, ascertains whether the clamping operation of the substrate to the electrostatic chuck has been performed in a normal manner without relying on electrical properties of the substrate, wherein the clamping operation comprises:

performing a first measurement associated with the first distance, wherein the first measurement is performed when the first distance remains constant;

applying the predetermined voltage to the electrode of the electrostatic chuck; and performing a second measurement associated with the second distance, wherein the second measurement is performed when the second distance remains constant.

* * * * *